US00RE40163E

(19) United States
(12) Reissued Patent
Hori et al.

(10) Patent Number: US RE40,163 E
(45) Date of Reissued Patent: Mar. 25, 2008

(54) SEMICONDUCTOR LIGHT-EMITTING ELEMENT

(75) Inventors: Yuji Hori, Nagoya (JP); Tomohiko Shibata, Kasugai (JP); Mitsuhiro Tanaka, Handa (JP); Osamu Oda, Nishikasugai-Gun (JP)

(73) Assignee: NGK Insulators, Ltd., Nagoya (JP)

(21) Appl. No.: 11/083,331

(22) Filed: Mar. 17, 2005

Related U.S. Patent Documents

Reissue of:
(64) Patent No.: 6,534,795
Issued: Mar. 18, 2003
Appl. No.: 09/994,370
Filed: Nov. 27, 2001

(30) Foreign Application Priority Data

Nov. 30, 2000 (JP) ..... 2000-364268
Oct. 18, 2001 (JP) ..... 2001-321052

(51) Int. Cl.
*H01L 31/12* (2006.01)

(52) U.S. Cl. ..... 257/79; 257/77; 257/82; 257/173; 438/22; 438/604

(58) Field of Classification Search ..... 257/13, 257/79, 82, 183, E25.032, 282; 438/22, 24, 438/604
See application file for complete search history.

(56) References Cited

U.S. PATENT DOCUMENTS

| | | | | |
|---|---|---|---|---|
| 5,075,742 | A | 12/1991 | Gerard et al. | |
| 5,523,589 | A * | 6/1996 | Edmond et al. | 257/77 |
| 5,684,309 | A | 11/1997 | McIntosh et al. | |
| 5,963,787 | A * | 10/1999 | Kimura et al. | 438/46 |
| 6,177,292 | B1 * | 1/2001 | Hong et al. | 438/46 |
| 6,177,684 | B1 * | 1/2001 | Sugiyama | 257/17 |

FOREIGN PATENT DOCUMENTS

| | | |
|---|---|---|
| EP | 0 437 385 | 7/1991 |
| JP | 09-018053 | 1/1997 |
| JP | 09/064477 | 3/1997 |
| JP | 10-027923 | 1/1998 |
| JP | 10-079501 | 3/1998 |
| JP | 11-340147 | 12/1999 |
| JP | 11-354839 | 12/1999 |
| JP | 11-354840 | 12/1999 |
| JP | 11-354842 | 12/1999 |
| JP | 2000-091703 | 3/2000 |

OTHER PUBLICATIONS

Damilano et al., "From visible to white light emission by GaN quantum dots on Si(111) substrate", American Institute of Physics, Applied Physics Letters, vol. 75, No. 7, Aug. 16 1999, pp. 962–964.

Rouviére et al., "Preferential nucleation of GaN quantum dots at the edge of A1N threading dislocations", American Institute of Physics, Applied Physics Letters, vol. 75, No. 17, Oct. 25, 1999, pp. 2632–2634.

Hirayama et al., "Intense photoluminescence from self–assembling InGaN quantum dots artificially fabricated on A1GaN surfaces", American Institute of Physics, Applied Physics Letters, vol. 72, No. 14, Apr. 6, 1998, pp. 1736–1738.

(Continued)

*Primary Examiner*—Long K. Tran
(74) *Attorney, Agent, or Firm*—Burr & Brown

(57) ABSTRACT

In a semiconductor light-emitting element, an underlayer is composed of a high crystallinity AlN layer having a FWHM in X-ray rocking curve of 90 seconds or below, and a first cladding layer is composed of an n-AlGaN layer. A light-emitting layer is composed of a base layer made of i-GaN and plural island-shaped single crystal portions made of i-AlGaInN isolated in the base layer.

18 Claims, 2 Drawing Sheets

OTHER PUBLICATIONS

Widmann et al., "Growth kinetics and optical properties of self–organized GaN quantum dots", American Institute of Physics, Journal of Applied Physics, vol. 83, No. 12, Jun. 15, 1998, pp. 7618–7624.

Ohba et al., "Growth of High–Quality A1N and A1N/GaN/A1N Heterostructure on Sapphire Substrate", Jpn. J. Appl. Phys. Vol. 35 (1996), Part 2, No. 8B, Aug. 15 1996, pp. L1013–L1015.

Yamamoto et al., "Nitridation effects of substrate surface on the metalorganic chemical vapor deposition growth of InN on Si and $\alpha$–$A1_2$, $O_3$substrates", 2300 Journal of Crystal Growth, 127 (1994) Apr., Nos. 3/4, pp. 415–420.

* cited by examiner

SEMICONDUCTOR LIGHT-EMITTING ELEMENT

Matter enclosed in heavy brackets [ ] appears in the original patent but forms no part of this reissue specification; matter printed in italics indicates the additions made by reissue.

BACKGROUND OF THE INVENTION (1) Field of Invention

This invention relates to a semiconductor light-emitting element, particularly usable for a white light-emitting diode.

(2) Related Art Statement

Recently, various light-emitting diodes (LEDs) are widely available. LEDs are expected for illuminating use as well as displaying use because of their low electric power consumption, long life time, $CO_2$ gas reduction originated from the reduction of the high energy consumption such as the low electric power consumption, and thus, much demand for the LEDs are expected.

As of now, the LEDs are made of various semi-conducting material such as GaAs-based semi-conducting material, AlGaAs-based semi-conducting material, GaP-based semi-conducting material, GaAsP-based semi-conducting material and InGaAlP-based semi-conducting material, and thus, can emit various color lights from red to yellow-green. Therefore, the LEDs are employed particularly for various displaying use. Recently, blue and green LEDs have been realized by using GaN-based semi-conducting material. As a result, selecting a given LED, a given color light from red to blue, that is, within visible light range, can be obtained from the LED, and full-color displaying is also realized. Moreover, white light-emitting diodes (white LEDS) are being realized by using RGB LED chips or using two color lights-emitting diodes composed of blue LEDs with yellow fluorescent substance thereon. As a result, LED illumination is being realized at present.

However, the white LED using the RGB LED chips requires higher cost because the plural LED chips are employed, so that in view of the cost, it is difficult to employ the white LED for illumination use. On the other hand, full color can not be recognized by the white LED using the two color lights-emitting diode because it employs only two primary colors, not three primary colors. Moreover, in the white LED, the brightness of only about 25 lm/w can be realized, which is very small as compared with the brightness of 90 lm/W of a fluorescent tube.

Therefore, a white LED employing three primary colors is strongly desired all over the world because of the low energy consumption taking environmental problem into consideration. In reality, such a white LED is intensely developed by Japanese national professions and foreign major electric-manufacturing enterprises.

Such an attempt is made as to fabricate a white LED using three or over primary colors as illuminating a three primary colors-fluorescent substance by an ultraviolet LED. This attempt is fundamentally based on the same principle as a fluorescent tube, and employs the ultraviolet LED as the ultraviolet beam from the mercury discharge in the fluorescent tube. In this case, the cost of the white LED is increased because the three primary colors-fluorescent substance is additionally employed for the ultraviolet LED. Using a GaN-based semi-conducting material, a blue LED cab be realized, and then, using the GaN-based semi-conducting material, the ultraviolet LED can be realized. However, the luminous efficiency of the resulting ultraviolet LED is largely reduced, as compared with the blue LED.

The luminescence reduction is considered as follows. If the GaN-based semiconductor film is epitaxially grown on a substrate made of e.g., a sapphire single crystal, much misfit dislocations are created at the boundary between the film and the substrate due to the difference in lattice constant between the film and the substrate. The misfit dislocations are propagated in the film and a light-emitting layer provided on the film, and thus, many dislocations are created in the resulting LED.

In a blue LED or a green LED made of a GaN-based semi-conducting materials, the light emitting layer is made of an InGaN semi-conducting material. In this case, the In elements are partially located, and thus, some carriers are located and confined. Therefore, the carriers are recombined before they are moved and seized at the dislocations, so that the LED can exhibit its sufficient luminous efficiency.

That is, even though much dislocation are created in the light-emitting layer, the carriers are recombined and thus, a given luminescence is generated before they are moved and seized at the dislocation as non-luminescence centers, so that the blue LED or the green LED using the GaN-based semi-conducting materials can exhibit their high luminous efficiency.

For fabricating an ultraviolet LED, the In ratio of the light-emitting layer must be reduced. Therefore, the In elements are not almost located, and thus, the diffusion length of carrier is elongated. As a result, the carriers are easily moved at and recombined with the dislocations in the light-emitting layer. In this way, the luminous efficiency of the ultraviolet LED is reduced due to the large amount of dislocation in the light-emitting layer, as compared with the blue LED. In this point of view, various dislocation-reducing method are researched and developed.

For example, such an ELO technique is proposed as fabricating a strip mask made of $SiO_2$ during an epitaxial process and preventing the propagation of the misfit dislocations created at the boundary between the epitaxial film and a substrate. According to the ELO technique, a light-emitting layer having fewer dislocations can be formed above the substrate via the strip mask. However, the ELO technique is a complicated means, so that the manufacturing cost is increased. Then, in the ELO technique, a thicker layer made of e.g., a GaN-based semi-conducting material is formed on the substrate, which results in being curved. Practically, in a device manufacturing process, when epitaxial films are formed on their respective substrates by the ELO technique, the better half of the substrates is broken. Therefore, it is difficult to employ the ELO technique in a practical device manufacturing process, particularly for LEDs.

In addition, an attempt is made to epitaxially grow a bulky GaN single crystal for reducing the dislocation density of the resulting device, for example by using a high pressure solution growth method, a vapor phase epitaxial growth method or a flux method. As of now, however, such a bulky single crystal enough to be applied for the device manufacturing process is not grown and prospected.

For fabricating a bulky GaN single crystal of low dislocation density, an attempt is made to grow a thicker GaN single crystal on a substrate made of an oxide to match in lattice the GaN single crystal by a HVPE method, and thereafter, remove the substrate, to obtain only the GaN single crystal to be used as a substrate. However, the GaN single crystal enough to be industrially applied for LEDs has not been fabricated yet.

As a result, the high luminous efficiency in such a white LED as employing three or over primary colors through the illumination of a fluorescent substance by an ultraviolet LED is not technically prospected.

SUMMARY OF THE INVENTION

It is an object of the present invention to provide a new semiconductor light-emitting element preferably usable for a LED to emit an any color light regardless of the dislocation density, particularly a white LED.

For achieving the above object, this invention relates to a semiconductor light-emitting element including a substrate, an underlayer, formed on the substrate, made of a first semi-conducting nitride material including Al element and having a full width at half maximum (FWHM) in X-ray rocking curve of 90 seconds or below, a first conductive layer, formed on the underlayer, made of a second semi-conducting nitride material including at least one element selected from the group consisting of Al, Ga and In, a first cladding layer, formed on the first conductive layer, made of a third semi-conducting nitride material including at least one element selected from the group consisting of Al, Ga and In, a light-emitting layer composed of a base layer, formed on the first cladding layer, made of a fourth semi-conducting nitride material including at least one element selected from the group consisting of Al, Ga and In and plural isolated island-shaped single crystal portions, embedded in the base layer, made of a fifth semi-conducting nitride material including at least one element selected from the group consisting of Al, Ga and In and having an in-plane lattice constant larger than that of the third semi-conducting nitride material, a second cladding layer, formed on the light-emitting layer, made of a sixth semi-conducting nitride material including at least one element selected from the group consisting of Al, Ga and In, and a second conductive layer, formed on the second cladding layer, made of a seventh semi-conducting nitride material including at least one element selected from the group consisting of Al, Ga and In. Then, the bandgap of the third semi-conducting nitride material constituting the first cladding layer, the bandgap of the fourth semi-conducting nitride material constituting the base layer and the bandgap of the fifth semi-conducting nitride material become larger by turns. That is, the relation of the handgap of the third semi-conducting nitride material> the handgap of the fourth semi-conducting nitride material> the handgap of the fifth semi-conducting nitride material is satisfied.

In this case, if the function of a conductive layer is given to the first cladding layer, the first conductive layer may be removed. Similarly, if the function of a conductive layer is given to the second cladding layer, the second conductive layer may be removed.

Recently, such a LED as to be illuminated through a light-emitting layer having mismatched in lattice and isolated island-shaped single crystal portions have been intensely researched and developed. In the LED, if the sizes of the single crystal portions are dispersed, various color lights are emitted from the single crystal portions. The emitted various color lights are superimposed, thereby to emit an any color light or a white color light from the light-emitting layer.

However, more dislocations are propagated and created in the isolated island-shaped single crystal portions due to the low crystallinity of an underlayer for the light-emitting layer, regardless of the sizes the single crystal portions. Therefore, the luminous efficiency of the light-emitting layer is degraded due to the low crystallinity thereof. As a result, such an any color LED or a white LED has not been realized yet.

Then, the inventors had been intensely studied to improve the crystallinity of the island-shaped single crystal portions constituting the light-emitting layer, and thus, made an attempt to improve the crystallinity of the underlayer by which the crystallinity of the single crystal portions are affected.

Conventionally, the function as a buffer layer is regarded as most important for the underlayer in a semiconductor light-emitting element, and as a result, attention is not paid to the crystallinity of the underlayer. In addition, it is desired for functioning as the buffer layer sufficiently that the underlayer has a relatively low crystallinity.

On the other hand, the inventor found out that, in the case of making a light-emitting element of Al-including semi-conducting nitride materials, if the crystallinity of the underlayer is developed to some degree, the underlayer can function as a buffer layer.

Therefore, if the crystallinity of the underlayer including Al element is developed to full width at half maximum in X-ray rocking curve of 90 seconds or below in the semi-conductor light-emitting element according to the present invention, the underlayer can function as a buffer layer sufficiently and the crystallinity of the island-shaped single crystal portions constituting the light-emitting layer can be developed due to the high crystallinity of the underlayer.

In the semiconductor light-emitting element of the present invention, the in-plane lattice constant of the fifth semi-conducting nitride material constituting the island-shaped single crystal portion is set to be larger that the in-plane lattice constant of the third semi-conducting nitride material constituting the first cladding layer. In this case, compression stress is affected on the fifth semi-conducting nitride material, which results in being shaped in dot. That is, the island-shaped single crystal portions are formed on the compressive stress.

Therefore, by adjusting the sizes of the island-shaped single crystal portions appropriately, a given wavelength light is emitted from each of the single crystal portions, and as a result, an any color light or a white light is generated and emitted from the light-emitting layer including the single crystal portions at a luminous efficiency enough to be practically used.

If at least one of the forming temperature, the (V raw material/III raw material) ratio, the forming pressure is controlled in forming the island-shaped single crystal portions by a MOCVD method, the sizes of the single crystal portions can be easily adjusted.

The bandgap arrangement in the third semi-conducting nitride material constituting the first cladding layer, the fourth semi-conducting nitride material constituting the base layer and the fifth semi-conducting nitride material constituting the island-shaped single crystal portions is required to confine the island-shaped single crystal portions energetically and emit a given wavelength light from each of the single crystal portions.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to the accompanying drawings.

Figure 1:
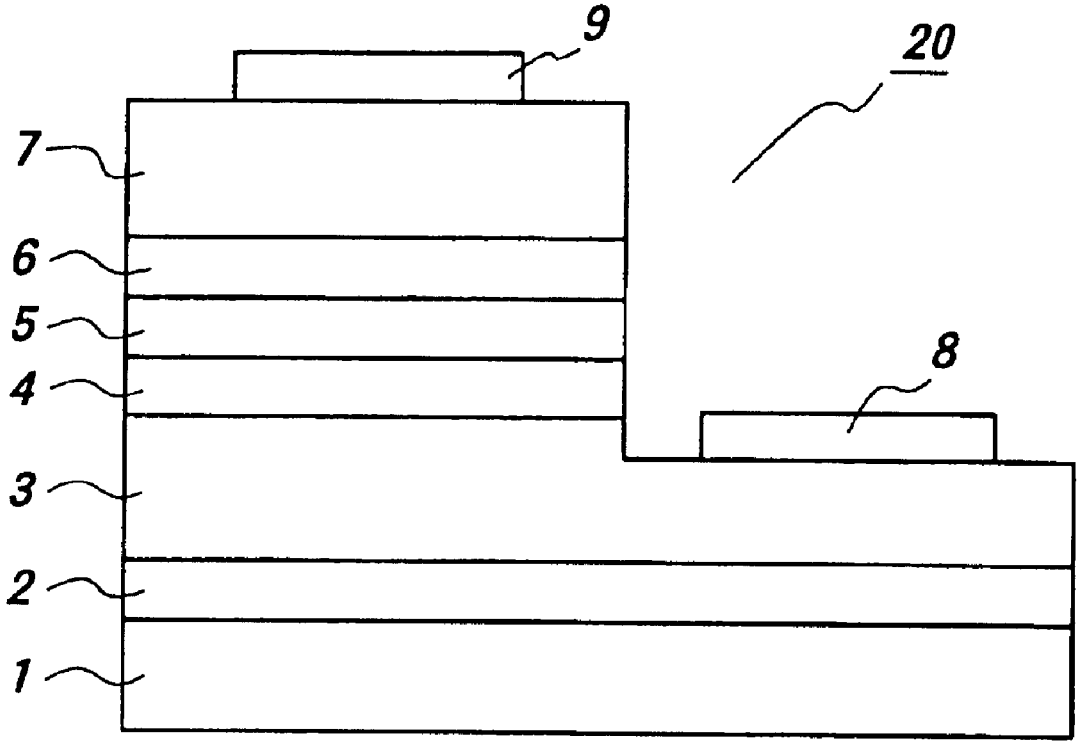
FIG. 1 is a cross sectional view showing a semiconductor light-emitting element according to the present invention.

FIG. 1 is a cross sectional view showing a semiconductor light-emitting element according to the present invention.

A semiconductor light-emitting element 20 depicted in FIG. 1 includes a substrate 1, an underlayer 2 made of AlN as a first semi-conducting nitride material formed on the substrate 1, and a first conductive layer 3 made of n-AlGaN as a second semi-conducting nitride material formed on the underlayer 2. Moreover, the element 20 includes a first cladding layer 4 made of n-AlGaN as a third semi-conducting nitride material formed on the first conductive layer 3, a light-emitting layer 5 formed on the first cladding layer 4, and a second cladding layer 6 made of p-AlGaN as a sixth semi-conducting nitride material. Then, a second conductive layer 7 made of p-GaN as a seventh semi-conducting nitride material is provided on the second cladding layer 6.

The first conductive layer 3 is partially removed and exposed, and an n-type electrode 8 of Al/Pt is provided on the exposed surface of the first conductive layer 3. Then, a p-type electrode 9 of Au/Ni is provided on the second conductive layer 7.

Figure 2:
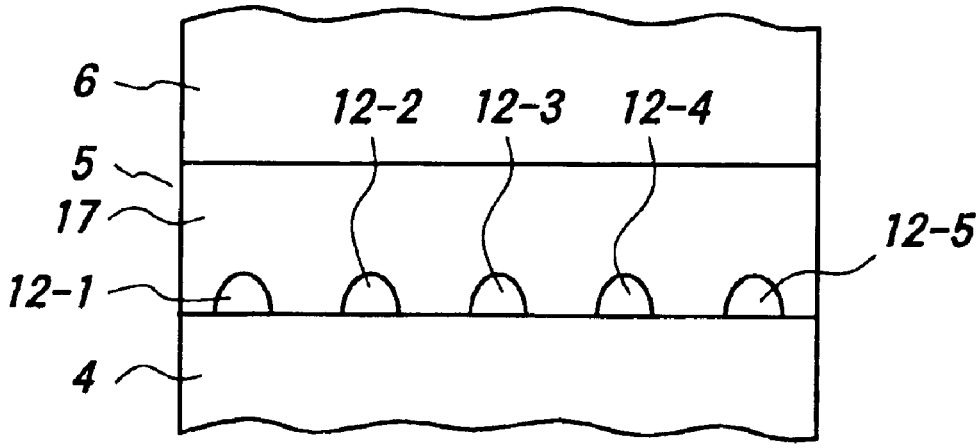
FIG. 2 is an enlarged view showing the light-emitting layer of a semiconductor light-emitting element according to the present invention.

FIG. 2 is an enlarged view showing the light-emitting layer 5 of the semiconductor light-emitting element 20. As is apparent from FIG. 2, the light-emitting layer 5 is composed of a base layer 17 made of i-GaN as a fourth semi-conducting nitride material and isolated island-shaped single crystal portions 12-1 through 12-5 made of i-AlGaInN as a fifth semi-conducting nitride material.

In FIGS. 1 and 2, for clarifying the characteristics of the semiconductor light-emitting element of the present invention, some constituting parts are different from the real ones.

It is required in the semiconductor light-emitting element 20 depicted in FIG. 1 that the full width at half maximum (FWHM) in X-ray rocking curve of the underlayer 2 is set to 90 seconds or below, particularly 50 seconds or below. In this case, the dislocation densities of the island-shaped single crystal portions 12-1 through 12-5 are reduced, and thus, the crystallinity of the single crystal portions 12-1 through 12-5 can be developed. As a result, the luminous efficiency of the semiconductor light-emitting element 20 can be enhanced.

Moreover, although the lower limited value of the FWHM of the underlayer 2 is not restricted, it is preferably set to 10 seconds so that the underlayer 2 also functions as a buffer layer.

Such a high crystallinity underlayer can be obtained through the MOCVD reaction of raw material gases on a substrate heated at 1100° C. or over, preferably 1150° C. or over. The underlayer of a conventional semiconductor light-emitting element is formed at 500–700° C. by using a MOCVD method. Therefore, the above-mentioned forming temperature for the underfilm is extremely higher than the conventional forming temperature. That is, in the present invention, the underlayer is formed on the quite different condition in a MOCVD method from the conventional one.

Although the upper limited value of the forming temperature of the underlayer is not restricted, it is preferably set to 1250° C. In this case, the surface roughness of the underlayer dependent on the composition of the first semi-conducting nitride material and so on and the component diffusion in the underlayer can be effectively prevented. As a result, the crystallinity of the underlayer can be maintained in good condition, independent on the composition of the first semi-conducting nitride material constituting the underlayer, and the crystallinity deterioration of the light-emitting layer due to the surface roughness of the underlayer can be effectively prevented. Herein, the "forming temperature" means a "setting temperature for the substrate".

It is desired that the thickness of the underlayer is set to 0.5 μm or over, particularly within 1–3 μm. It is desired for developing the crystallinities of the conductive layer, the cladding layer and the light-emitting layer that the underlayer is formed thicker. However, in too thick underlayer, some cracks may be created and breakaway from a substrate may occur. Therefore, particularly within the above-mentioned temperature range, the thickness of the underlayer is set within the above-mentioned range so as to develop the crystallinity of the underlayer.

Moreover, it is required in the semiconductor light-emitting element 20 that the in-plane lattice constant of the fifth semi-conducting nitride material constituting the island-shaped single crystal portions 12 is set to be larger than the in-plane lattice constant of the third nitride semi-conductor constituting the first cladding layer 4. Concretely, the difference in in-plane lattice constant between the semi-conducting nitride materials is set within 0.4–14%, particularly 2–8% by the ratio for the in-plane lattice constant of the first semi-conducting nitride material. In this case, the island-shaped single crystal portions can be easily formed by a normal MOCVD method.

As mentioned above, if the sizes of the island-shaped single crystal portions 12-1 through 12-5 constituting the light-emitting layer 5 in the semiconductor light-emitting element 20 are adjusted and dispersed appropriately, a given wavelength light is emitted from each of the single crystal portions. As a result, an any color light or a white light can be generated and emitted from the light-emitting layer 5 entirely.

Concretely, the diameters of the island-shaped single crystal portions 12-1 through 12-5 are dispersed within 5–30 nm, respectively. In this case, a white light can be generated and emitted from the light-emitting layer 5 entirely on the synthesis of the lights emitted from the single crystal portions 12-1 through 12-5.

Such island-shaped single crystal portions dispersed within the above-mentioned range can be formed by controlling the forming temperature, the (V raw material/III raw material) ratio, the forming pressure and so on, appropriately.

Figure 3:
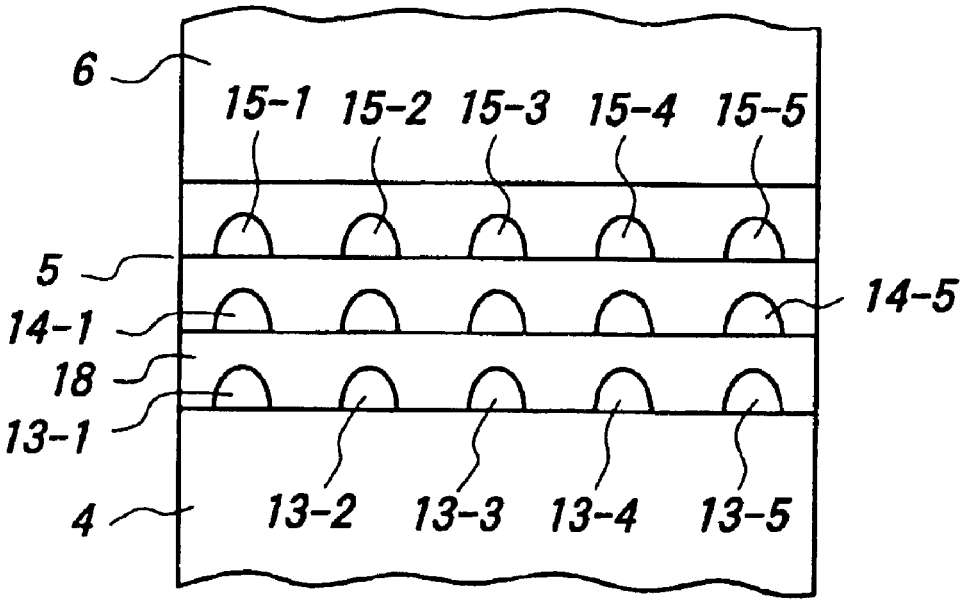
FIG. 3 is an enlarged view showing the light-emitting layer of another semiconductor light-emitting element according to the present invention.

FIG. 3 is a schematic view showing a modified embodiment of the light-emitting layer shown in FIG. 2. In FIG. 3, the light-emitting layer 5 is composed of a base layer 18 and isolated island-shaped single crystal portions 13-1 through 13-5, 14-1 through 14-5 and 15-1 through 15-5 which are stepwisely formed. In this case, the degree of freedom in size for the single crystal portions can be increased, and thus, the controllability of the single crystal portion in size can be increased. As a result, a given light within a wide color range can be easily generated and emitted from the light-emitting layer entirely.

Concretely, the average diameter in the bottom surfaces of the island-shaped single crystal portions 13-1 through 13-5, 14-1 through 14-5, and 15-1 through 15-5 is set within 5–30 nm. In this case, a given color light is emitted from the plural island-shaped single crystal portions arranged in their respective steps, and thus, a white light is emitted from the light-emitting layer 5 entirely.

Such island-shaped single crystal portions as formed within above-mentioned range can be formed by controlling the forming temperature, the (V raw material gas/III raw material gas) ratio, the forming pressure and so on, appropriately.

Moreover, in each step, for example, the sizes of the island-shaped single crystal portions 13-1 through 13-5 may be dispersed within a given range. In this case, an any color light can be emitted from the light-emitting layer 5 entirely, as explained in FIG. 2.

Particularly, if the diameters of the island-shaped single crystal portions are dispersed within 5–30 nm in their respective arranged steps, white lights are emitted from the respective single crystal portions arranged in the respective steps. Therefore, in this case, too, a white light can be generated and emitted from the light-emitting layer 5 entirely.

If the underlayer made of the first semi-conducting nitride material is formed thicker, some cracks may be created in the underlayer due to the increase of the tensile stress from the first conductive layer made of the second semi-conducting nitride material.

In this case, it is desired that the Al content in the first semi-conducting nitride material constituting the underlayer is continuously or stepwisely decreased to the first conductive layer from the substrate. Thereby, the Al content of the underlayer near the first conductive layer is decreased, and thus, the difference in Al content between the underlayer and the first conductive layer at their boundary is decreased.

As a result, the difference in lattice constant between the underlayer and the first conductive layer is decreased, and thus, cracks are not almost created in the underlayer even though the thickness of the underlayer is increased. Herein, the variation degree of the Al content in the underlayer is appropriately determined so that cracks are not created in the underlayer.

In the semiconductor light-emitting element of the present invention, it is required that the semi-conducting nitride materials such as the first semi-conducting nitride material include at least one element selected from the group consisting of Al, Ga and In. In addition, the semi-conducting nitride materials may include an additive element such as Ge, Si, Mg, Zn, Be, P or B as occasion demands. Moreover, the semi-conducting nitride materials may include a minute impurity contained in the raw material gases and the reactor or contained dependent on the forming condition. Only if the above conditions are satisfied, the compositions of the first through the seventh semi-conducting nitride materials may be set appropriately, in view of the magnitudes of their respective bandgaps.

In the semiconductor light-emitting element of the present invention, the substrate may be made of oxide single crystal such as sapphire single crystals, ZnO single crystal, $LiAlO_2$ single crystal, $LiGaO_2$ single crystal, $MgAl_2O_4$ single crystal, or MgO single crystal, IV single crystal or IV—IV single crystal such as Si single crystal or SiC single crystal, III–V single crystal such as GaAs single crystal, AlN single crystal, GaN single crystal or AlGaN single crystal, and boride single crystal such as $Zr_2B_2$.

Particularly, in the case of making the substrate of the sapphire single crystal, it is desired that surface-nitriding treatment is performed on the main surface for the underlayer or the like to be formed. The surface-nitriding treatment is performed as follows. First of all, the sapphire single crystal substrate is set in a nitrogen-including atmosphere such as an ammonia atmosphere, and then, heated for a given period. The thickness of the resulting surface nitride layer can be adjusted by controlling the nitrogen concentration, the nitriding temperature and the nitriding period appropriately.

If the sapphire single crystal substrate having the surface nitriding layer thereon is employed, the crystallinity of the underlayer formed directly on the main surface can be more enhanced. Moreover, since the underlayer can be easily formed thicker, for example, up to the upper limit value 3 μm of the above-mentioned preferable thickness range, not by using a specific forming condition, the crystallinity of the underlayer can be easily more enhanced due to the increase in thickness.

Consequently, if the sapphire single crystal having the surface nitriding layer is employed, the crystallinity of the underlayer is developed, and thus, the total crystallinity of the semiconductor light-emitting element including the conductive layer, the cladding layer, and the light-emitting layer can be developed.

In addition, if the sapphire single crystal having the surface nitriding layer is employed, the high crystallinity underlayer can be made even at 1200° C. or below, particularly around 1150° C., within the above-mentioned preferable forming temperature range.

It is desired that the surface-nitriding layer is formed thicker, for example, so that the nitrogen content of the sapphire single crystal substrate at the depth of 1 nm from the main surface is set to five atomic percentages or over, in ESCA analysis.

In such a semiconductor light-emitting element as shown in FIG. 1 according to the present invention, the underlayer, the first conductive layer and the light-emitting layer may be formed by a normal MOCVD method or the like only if the above-mentioned requirements are satisfied.

EXAMPLE

A sapphire single crystal substrate having a diameter of 2 inches and a thickness of 500 μm was employed, and thus, pre-treated by $H_2SO_4$+$H_2O_2$, and set into a MOCVD apparatus. To the MOCVD apparatus was attached a gas system of $H_2$, $N_2$, TMA, TMI, TMG, $Cp_2Mg$, $NH_3$ and $SiH_4$. Then, the substrate was heated to 1200° C. with flowing $II_2$ gas at a rate of 10 m/sec.

First of all, an ammonia gas ($NH_3$) was flown with a $H_2$ carrier gas for five minutes, to nitride the main surface of the substrate. In ESCA analysis, it was turned out that a surface-nitriding layer was formed on the main surface by the surface-nitriding treatment, and the nitrogen content at the depth of 1 nm from the main surface was seven atomic percentages.

Then, TMA and $NH_3$ were flown at an average rate of 10 m/sec, to form an AlN film in a thickness of 1 μm as an underlayer. The FWHM in X-ray rocking curve of the AlN film was 90 seconds, and thus, the good crystallinity of the AlN film was confirmed.

Then, for protecting the AlN film, TMG and $HN_3$ were flown at an average rate of 10 m/sec, to form a GaN film in a thickness of 100 Å on the AlN film. Thereafter, the substrate having the AlN film and the GaN film was taken out of the MOCVD apparatus, and then, set into a MBE apparatus.

To the MBE apparatus were attached a solid raw material system of 7N-Ga, 7N-In, 6N-Al and a nitrogen gas system of atomic nitrogen gas generated by the high frequency plasma-generating apparatus at SVTA Co. Ltd. Moreover, to the MBE apparatus were attached a Si doping system and a Mg doping system so as to dope the n-type dopant Si and the p-type dopant Mg, respectively.

First of all, the substrate was heated to 900° C., and $H_2$ and $NH_3$ were flown, to remove the GaN film as a protective layer. Thereafter, the substrate was heated to 1000° C. and held for 30 minutes, to flatten the surface of the AlN film, and a Si-doped n-AlGaN layer as a first conductive layer was formed in a thickness of 1 μm at 750° C.

Then, a Si-doped n-$Al_{0.2}Ga_{0.8}N$ layer was formed, as a first cladding layer, in a thickness of 1000 Å on the n-AlGaN layer at 760° C. Thereafter, island-shaped single crystal portions, to constitute a light-emitting layer, were made of $In_{0.1}Ga_{0.9}N$ in a thickness (height) of 100 Å and an average diameter of 100 Å at 700° C. Then, an GaN layer as a base layer, to constitute the light-emitting layer, was formed in a thickness of 200 Å at 750° C., so as to embed the isolated island-shaped single crystal portions.

Then, a Mg-doped p-$Al_{0.2}Ga_{0.8}N$ layer was formed, as a second cladding layer, in a thickness of 50 Å on the GaN film at 780° C., and finally, a Mg-doped p-GaN layer was formed as a second conductive layer, in a thickness of 2000 Å at 780° C.

Thereafter, the resulting multi-layered structured was partially removed, to expose partially the first conductive layer of the Si-doped n-AlGaN layer. Then, a p-type electrode of Au/Ni was provided on the second conductive layer of the Mg-doped p-GaN layer, and an n-type electrode of Al/Ti was provided on the exposed surface of the first conductive layer.

Thereafter, when a voltage of 3.5V was applied between the p-type electrode and the n-type electrode, to flow a current of 20 mA through the thus obtained semiconductor light-emitting element, a blue light was emitted from the element of a high luminous efficiency. Therefore, it was confirmed that the semiconductor light-emitting element was practically usable. In this point of view, controlling the dispersion of the island-shaped single crystal portions in their sizes, a white light can be emitted from the semiconductor light-emitting element.

Although the present invention was described in detail with reference to the above examples, this invention is not limited to the above disclosure and every kind of variation and modification may be made without departing from the scope of the present invention.

For example, in the semiconductor light-emitting elements shown in FIG. 1 and Example, the lower side layers from the light-emitting layer are made of n-type semi-conducting materials, and the upper side layers from the light-emitting layer are made of p-type semi-conducting materials, but the other way around will do. Moreover, in FIG. 3, although the island-shaped single crystal portions are formed in three steps, they may be in two steps or four or over steps.

In Example, the AlN underlayer and the AlGaN conductive layer or the like were fabricated in their respective different apparatuses, but may be continuously fabricated in the same apparatus without taking out of the apparatus. Although, in Example, the AlGaN conductive layer or the like were formed directly on the AlN underlayer, they may be formed on a buffer layer or a multi-layered stacking films which is provided on the substrate by a given forming condition such as the forming temperature, the flow rate of raw material gas, the forming pressure, the amount of raw material gas and the amount of additive material gas.

As mentioned above, in the semiconductor light-emitting element of the present invention, the light-emitting layer is composed of isolated island-shaped single crystal portions, and the underlayer is made of high crystallinity semi-conducting nitride material. As a result, the crystallinities of the island-shaped single crystal portions are developed, and thus, the luminous efficiency of the semiconductor light-emitting element can be developed.

Consequently, the semiconductor light-emitting element having the light-emitting layer composed of the island-shaped single crystal portions practically usable can be provided, and when the island-shaped single crystal portions are dispersed appropriately in their sizes, a white light can be emitted from the semiconductor light-emitting element.

What is claimed is:

1. A semiconductor light-emitting element comprising:

a *sapphire single crystal* substrate *having a surface nitriding layer on a main surface thereof*, an underlayer, formed on the *surface nitriding layer on the main surface of the* substrate, *and being* made of a first semi-conducting nitride material including Al element and having a full width at half maximum (FWHM) in X-ray rocking curve of 90 seconds or below, a first conductive layer, formed on the underlayer, made of a second semi-conducting nitride material including at least one element selected from the group consisting of Al, Ga and In, a first cladding layer, formed on the first conductive layer, made of a third semi-conducting nitride material including at least one element selected from the group consisting of Al, Ga and In, a light-emitting layer composed of a base layer, formed on the first cladding layer, made of a fourth semi-conducting nitride material including at least one element selected from the group consisting of Al, Ga and In and plural isolated island-shaped single crystal portions, embedded in the base layer, made of a fifth semi-conducting nitride material including at least one element selected from the group consisting of Al, Ga and In and having an in-plane lattice constant larger than that of the third semi-conducting nitride material, a second cladding layer, formed on the light-emitting layer, made of a sixth semi-conducting nitride material including at least one element selected from the group consisting of Al, Ga and In, and a second conductive layer, formed on the second cladding layer, made of a seventh semi-conducting nitride material including at least one element selected from the group consisting of Al, Ga and In,

[the bandgap of the third semi-conducting nitride material constituting the first cladding layer,] the bandgap of the fourth semi-conducting nitride material constituting the base layer and the bandgap of the fifth semi-conducting nitride material becoming larger by turns *to satisfy the following relationship: the band gap of the fourth semi-conducting nitride material>the bandgap of the fifth semi-conducting nitride material.*

2. A semiconductor ligth-emitting element as defined in claim 1, wherein the Al content of the first semi-conducting nitride material constituting the underlayer is set to 50 atomic percentages or over for the total content of III element.

3. A semiconductor light-emitting element as defined in claim 2, wherein the first semi-conducting nitride material constituting the underlayer is AlN.

4. A semiconductor light-emitting element as defined in claim 1, wherein the second semi-conducting nitride material constituting the first conductive layer includes at least Al element.

5. A semiconductor ligth-emitting element as defined in claim 4, wherein the Al content of the second semi-conducting nitride material constituting the first conductive layer is set to 50 atomic percentages or over for the total content of III element.

6. A semiconductor light-emitting element as defined in claim 5, wherein the second semi-conducting nitride material constituting the underlayer is AlN.

7. A semiconductor light-emitting element as defined in claim 1, wherein the first semi-conducting nitride material constituting the underlayer is made at 1100° C. or over by a MOCVD method.

8. A semiconductor light-emitting element as defined in claim 7, wherein the first semi-conducting nitride material constituting the underlayer is made within 1100–1250° C. by a MOCVD method.

[9. A semiconductor light-emitting element as defined in claim 1, wherein the substrate is composed of a sapphire single crystal substrate, and the underlayer is formed on the main surface of the substrate via the surface-nitriding layer formed at the main surface by a surface-nitriding treatment.]

10. A semiconductor light-emitting element as defined in claim 1, wherein the difference in in-plane lattice constant between the third semi-conducting nitride material constituting the first cladding layer and the fifth semi-conducting nitride material constituting the island-shaped single crystal portions is set within 0.4–14% by the ratio for the in-plane lattice constant of the first semi-conducting nitride material.

11. A semiconductor light-emitting element as defined in claim 1, wherein the plural island-shaped single crystal portions are dispersed in their sizes, and thus, an any color light is emitted from the light-emitting layer entirely.

12. A semiconductor light-emitting element as defined in claim 11, wherein the diameters of the island-shaped single crystal portions are dispersed within 5–30 nm, and thus, a given wavelength light is emitted from each island-shaped single crystal portion and a white light is emitted from the light-emitting layer entirely.

13. A semiconductor light-emitting element as defined in claim 1, wherein the plural island-shaped single crystal portions are arranged stepwisely in the base layer, and a given wavelength light is emitted from each island-shaped single crystal portion, and thus, an any color light is emitted from the light-emitting layer entirely.

14. A semiconductor light-emitting element as defined in claim 13, wherein the sizes of the island-shaped single crystal portions are dispersed in their respective arranged steps in the base layer constituting the light-emitting layer.

15. A semiconductor light-emitting element as defined in claim 13, wherein the average sizes of the island-shaped single crystal portions are dispersed over the steps in the base layer constituting the light-emitting layer, and thus, an any color light is emitted from the light-emitting layer entirely.

16. A semiconductor light-emitting element as defined in claim 15, wherein the average sizes of the island-shaped single crystal portions are dispersed within 5–30 nm over the steps in the base layer constituting the light-emitting layer, and thus, a given wavelength light is emitted from each island-shaped single crystal portion arranged stepwisely, and a white light is emitted from the light-emitting layer entirely.

17. A semiconductor light-emitting element as defined in claim 1, wherein the Al content of the first semi-conducting nitride material constituting the underlayer is continuously or stepwisely decreased to the first conductive layer from the substrate.

*18. A semiconductor light-emitting element as defined in claim 1, wherein the bandgap of the third semi-conducting nitride material>the bandgap of the fourth semi-conducting nitride material.*

*19. A semiconductor light-emitting element comprising:*

*a substrate,*

*an underlayer having a thickness in a range of 1-3 μm formed on a main surface of the substrate, and being made of a first semi-conducting nitride material including Al element and having a full width at half maximum (FWHM) in X-ray rocking curve of 90 seconds or below,*

*a first conductive layer, formed on the underlayer, made of a second semi-conducting nitride material including at least one element selected from the group consisting of Al, Ga and In,*

*a first cladding layer, formed on the first conductive layer, made of a third semi-conducting nitride material including at least one element selected from the group consisting of Al, Ga and In,*

*a light-emitting layer composed of a base layer, formed on the first cladding layer, made of a fourth semi-conducting nitride material including at least one element selected from the group consisting of Al, Ga and In and plural isolated island-shaped single crystal portions, embedded in the base layer, made of a fifth semi-conducting nitride material including at least one element selected from the group consisting of Al, Ga and In and having an in-plane lattice constant larger than that of the third semi-conducting nitride material,*

*a second cladding layer, formed on the light-emitting layer, made of a sixth semi-conducting nitride material including at least one element selected from the group consisting of Al, Ga and In, and*

*a second conductive layer, formed on the second cladding layer, made of a seventh semi-conducting nitride material including at least one element selected from the group consisting of Al, Ga and In,*

*the bandgap of the fourth semi-conducting nitride material constituting the base layer and the bandgap of the fifth semi-conducting nitride material becoming larger by turns to satisfy the following relationship: the bandgap of the fourth semi-conducting nitride material>the bandgap of the fifth semi-conducting nitride material.*

* * * * *

UNITED STATES PATENT AND TRADEMARK OFFICE

CERTIFICATE OF CORRECTION

PATENT NO. : RE 40,163 E
APPLICATION NO. : 11/083331
DATED : March 25, 2008
INVENTOR(S) : Yuji Hori et al.

It is certified that error appears in the above-identified patent and that said Letters Patent is hereby corrected as shown below:

Title Page, Item (56) Other Publications

*Please change* "Yamamoto et al., "Nitridation effects of substrate surface on the metalorganic chemical vapor deposition growth of InN on Si and $\alpha$-$Al_2,O_3$ substrates", 2300 Journal of Crystal Growth, 127 (1994) Apr., Nos. 3/4, pp. 415-420." *to* --Yamamoto et al., "Nitridation effects of substrate surface on the metalorganic chemical vapor deposition growth of InN on Si and $\alpha$-$Al_2O_3$ substrates", 2300 Journal of Crystal Growth, 137 (1994) Apr., Nos. 3/4, pp. 415-420.--

Column 10

*Line 59*: please change "band gap" to --bandgap--
*Line 62*: please change "ligth-emitting" to --light-emitting--

Column 11

*Line 8*: please change "ligth-emitting" to --light-emitting--

Signed and Sealed this

Fifth Day of August, 2008

JON W. DUDAS
*Director of the United States Patent and Trademark Office*